United States Patent
Varadarajan et al.

(10) Patent No.: US 10,165,705 B2
(45) Date of Patent: Dec. 25, 2018

(54) PARTITIONED COOLING FOR ELECTRONIC DEVICES AND SYSTEMS

(71) Applicant: Intel Corporation, Santa Clara, CA (US)

(72) Inventors: Krishnakumar Varadarajan, Bangalore (IN); Anand V. Reddy, Bangalore (IN)

(73) Assignee: INTEL CORPORATION, Santa Clara, CA (US)

( * ) Notice: Subject to any disclaimer, the term of this patent is extended or adjusted under 35 U.S.C. 154(b) by 206 days.

(21) Appl. No.: 14/905,275

(22) PCT Filed: Aug. 22, 2014

(86) PCT No.: PCT/US2014/052370
§ 371 (c)(1),
(2) Date: Jan. 14, 2016

(87) PCT Pub. No.: WO2015/047615
PCT Pub. Date: Apr. 2, 2015

(65) Prior Publication Data
US 2016/0165751 A1    Jun. 9, 2016

(30) Foreign Application Priority Data
Sep. 26, 2013  (IN) .......................... 4361/CHE/2013

(51) Int. Cl.
*H05K 7/20* (2006.01)
*G06F 1/20* (2006.01)

(52) U.S. Cl.
CPC .......... *H05K 7/20136* (2013.01); *G06F 1/20* (2013.01); *G06F 1/206* (2013.01); *H05K 7/20336* (2013.01)

(58) Field of Classification Search
CPC .. H05K 7/20136; H05K 7/20336; G06F 1/20; G06F 1/206
(Continued)

(56) References Cited

U.S. PATENT DOCUMENTS 9,414,517 B2 *   8/2016  Yamaguchi ............. G06F 1/203
9,788,460 B2 * 10/2017  Barron ............... H05K 7/20509
(Continued)

FOREIGN PATENT DOCUMENTS

JP   2003-108269   4/2003

OTHER PUBLICATIONS

Official Letter and Search Report for Taiwanese Application No. 103132424 dated Jul. 4, 2016, 13 pages.
(Continued)

*Primary Examiner* — Justin Jonaitis
(74) *Attorney, Agent, or Firm* — Womble Bond Dickinson (US) LLP (57) ABSTRACT

Partitioned cooling for electronic devices and systems. An embodiment of an apparatus includes a casing; one or more components, including one or more components that include an active thermal element; a partition to separate area within the casing into a first cooling zone and a second cooling zone, wherein the first cooling zone provides cooling for the one or more components that include an active thermal element; and a first fan located in the first cooling zone, the first fan to produce airflow for cooling in the first cooling zone and a second fan located in the second cooling zone to produce airflow for the cooling in the second cooling zone.

20 Claims, 8 Drawing Sheets

(58) Field of Classification Search
USPC .......................................................... 165/80.2
See application file for complete search history.

(56) References Cited

U.S. PATENT DOCUMENTS

| | | | | |
|---|---|---|---|---|
| 2002/0067595 A1* | 6/2002 | Ogawa | ...................... | G06F 1/20 |
| | | | | 361/679.48 |
| 2004/0252458 A1* | 12/2004 | Arai | ........................ | G06F 1/206 |
| | | | | 361/695 |
| 2006/0232934 A1* | 10/2006 | Kusamoto | ............... | G06F 1/203 |
| | | | | 361/697 |
| 2011/0149504 A1* | 6/2011 | Wikander | ............... | G06F 1/203 |
| | | | | 361/679.47 |
| 2012/0170207 A1* | 7/2012 | Li | ............................. | G06F 1/16 |
| | | | | 361/679.47 |
| 2015/0261268 A1* | 9/2015 | Gong | ...................... | G06F 1/206 |
| | | | | 361/679.5 |

OTHER PUBLICATIONS

International Search Report and Written Opinion of the International Searching Authority dated Dec. 11, 2014, in International Patent Application No. PCT/US2014/052370, 14 pages.
International Written Opinion PCT Application No. US14/52370 dated Apr. 7, 2016, 11 pages.

* cited by examiner

PARTITIONED COOLING FOR ELECTRONIC DEVICES AND SYSTEMS

CROSS-REFERENCE TO RELATED APPLICATIONS

This application is a U.S. national phase of International Patent Application No. PCT/US2014/052370, filed Aug. 22, 2014; which claims priority from India Patent Application No. 4361/CHE/2013, filed Sep. 26, 2013, which applications are incorporated herein by reference in their entireties.

TECHNICAL FIELD

Embodiments described herein generally relate to the field of electronic devices and, more particularly, to partitioned cooling for electronic devices and systems.

BACKGROUND

In electronic devices and systems, including devices such as, for example, laptop and notebook computers and All-In-One computers, the generation of excess heat by processors and other electronic elements requires cooling to prevent damage to the circuit elements, reduce discomfort of users, and otherwise address problems that arise with excess heat. Cooling devices and processes may be active or passive, and may vary in sophistication.

Any cooling process must provide one or more means for allowing the excess heat to escape or be pushed out of the electronic device. However, in a thin system, the ability to cool a system is limited because of limitations in airflow created by the thin system structure.

The overall power envelope for a system is determined based in part on the available cooling limit. For thin systems, the standard cooling solution methodology that is commonly adopted in the industry greatly reduces the available cooling limit. The overall airflow in such a system required to cool the components and the skin acts to limit the performance of the system.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to partitioned cooling for electronic devices and systems.

Modern electronic devices and systems such as computing devices, including notebook and laptop computers and All-in-One computers, are designed with minimal depth to achieve a light and thin device for consumer use. In particular, mobile devices often minimize venting, and thus result in either reduced cooling capacity or a need for an expensive, high performance thermal solution. As used herein, "mobile device" means a mobile electronic device or system including a laptop or notebook computer, all-in-one computer, including portable all-in-one computers, Ultrabook device, tablet computer, cellular phone, smart phone, mobile Internet device (MID), handheld computers, personal digital assistants (PDAs), and other similar devices.

However, the thin design of such devices creates certain limitations in cooling, such as the cooling that is needed for a high performance processor and other heat generating devices. The limitations on cooling are caused at least in part by limits on airflow resulting from the thin system structure.

In an example, for a very thin system, the overall flow that achieved using industry standard technology system is approximately 0.5 to 0.6 CFM (cubic feet per minute), assuming two fans, a 12 mm system thickness, and standard layouts and battery capacities. With advanced technologies such as hyperbaric cooling, such flow rate may be increased, but the limitations remain with regard to resistances to airflow in a thin system.

In some embodiments, an apparatus or system provides additional cooling for thin systems through use of partitioned cooling. In some embodiments, the partitioned cooling provides cooling for devices with limited cooling ability, including effective operation in systems with thin bases and for limited active power.

In some embodiments, a cooling system for an apparatus is partitioned, with one or more fans including a first fan (referred to herein as an active fan) placed inside a partition, providing cooling for components that have an active thermal solution (such as a heat sink), which may be referred to as active components, and one or more fans including a second fan (referred to herein as a system fan) in a second partitioned cooling zone (the system cooling zone) to provide cooling for other components, wherein the components cooled by the second cooling zone may not include an active thermal solution, which may be referred to as non-active components. In some embodiments, the active components are located outside of the active cooling zone. In some embodiments, the active and non-active components are located in the system cooling zone. In some embodiments, one or more active components are located in both the active cooling zone and the system cooling zone.

In apparatuses and systems requiring fan cooling, the overall fan flow is generally dictated by three resistances to airflow, the resistances being:

(1) Fan inlets and squeeze;
(2) System pressure drop; and
(3) Heat sink pressure drop.

In some embodiments, by dividing the cooling solution for an apparatus or system into partitions, the active fan is not required to overcome the system pressure drop. Instead, the sole significant resistance for the active fan is the HX (heat exchanger) resistance. Similarly, the system fan does not have to overcome the heat sink pressure drop of the active cooling zone. As each of the pressure drops may contribute to a 40% resistance, this helps increase the air flow that can be achieved by each fan.

In an implementation of a cooling system for a thin electronic apparatus or system, in order to allow the active fan to be the only fan of the electronic system that is exposed to the heat exchanger, the active cooling zone is separated out from the remainder of the cooling system and enclosed in its own chamber. Because the active fan is separated from the remaining portion of the cooling system, it is possible to freely adjust the spacing of the heat sink to an optimal or improved spacing while maintaining the UL (Underwriters Laboratories) specification, rather than, for example, being restricted to 1 mm under a current design.

In some embodiments, the use of an optimally spaced heat sink allows additional flow and increases efficiency of the heat sink. In some embodiments, a system further utilizes the fan casing as a component of cooling. In thin systems, this improves HX efficiency by 10% to 20% resulting in cooling component and skin temperatures.

In some embodiments, a cooling system implementation improves heat exchanger operation by moving the heat exchanger outside the shadow of the cooling fan with the heat pipe being routed in a taller section of the casing, which can also be used to accommodate standard form factor connectors.

In an implementation including partitioned cooling with modification of spacing of the heating sink, utilization of fan casing for cooling, and modification of location of the heat exchanger a system flow of 1.6 CFM may be obtained for a system with an 8 mm thick base at a system operation acoustic level of 38 dBA (A-weighted decibels).

Figure 1A:
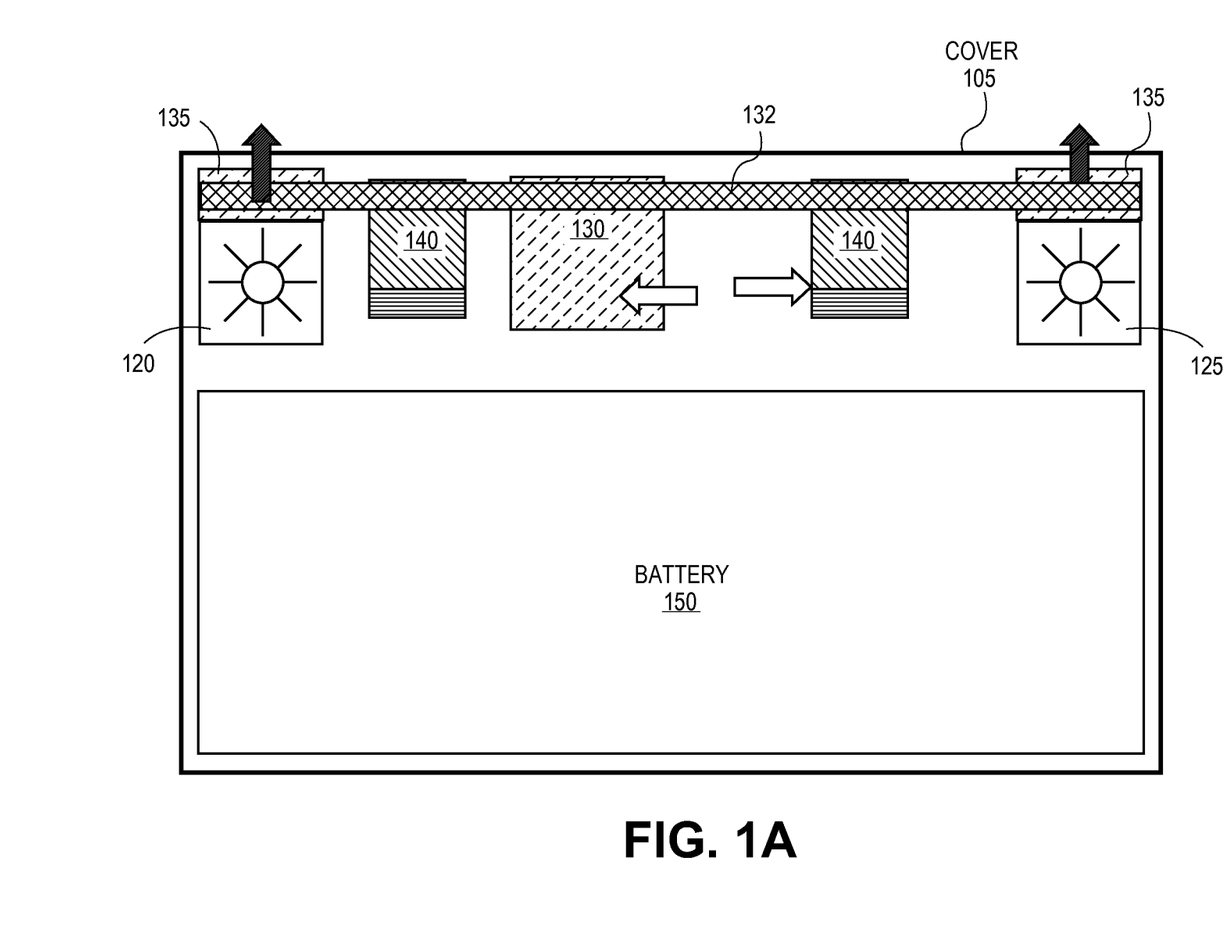
FIG. 1A is an illustration of an apparatus with a conventional cooling system.

FIG. 1A is an illustration of an electronic apparatus with a conventional cooling system. In this illustration, an electronic apparatus 100, such as a mobile device, includes a cover 105, and may be thin system. The apparatus 100 includes two fans for cooling, a first fan 120 and a second fan 125. The fans 120-125 generate airflow to cool system components. As illustrated, the system components may include one or more components having active thermal solutions 130, such as, for example a CPU with a heat sink, and one more components without active thermal solutions 140. The system may include cooling elements such as a heat exchanger 135 that is cooled by the fans and a heat pipe 132 to move heat from the active components to the heat exchanger, and one or more outlet vents to expel heated air. Air inlet vents for the fans may be present in, for example, the side edges of the cover 105.

The cooling system of the apparatus 100 has significant resistances to the airflow being pulled across the components, including pressure drop resistances. The resistances to airflow operate reduce the cooling capacity of the apparatus, which thus limits the performance of the apparatus 100.

Figure 1B:
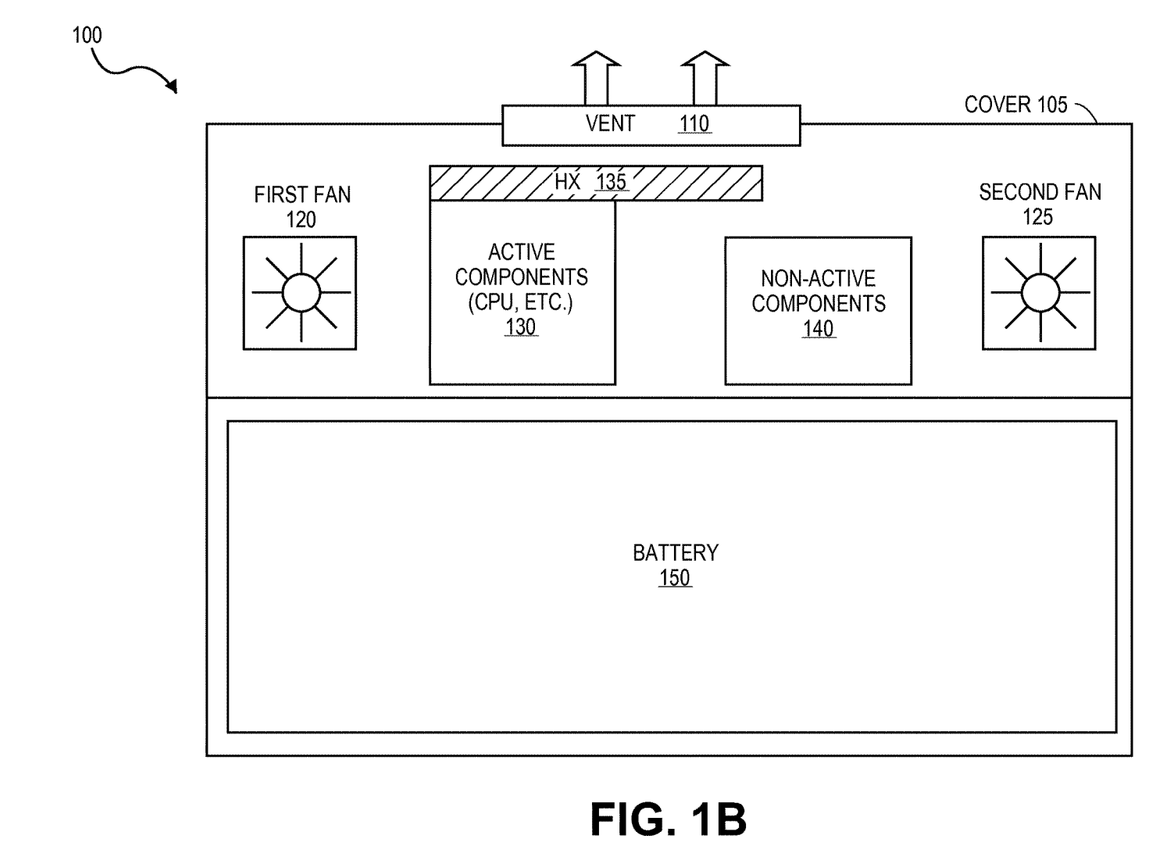
FIG. 1B is an illustration of an electronic apparatus with an advanced cooling system.

FIG. 1B is an illustration of an electronic apparatus with an advanced cooling system. In this illustration, an electronic apparatus 100, such as a laptop, notebook, or tablet computing system, includes an improved hyperbaric cooling system. As illustrated, the apparatus 100 may include a cover 105, and may be thin system. The apparatus 100 may include two (or more) fans for cooling, such as a first fan 120 and a second fan 125. The fans 120-125 generate airflow to cool system components, which may include one or more components having active thermal solutions 130, such as, for example a CPU with a heat sink, and one more components without active thermal solutions 140. The system may include cooling elements such as a heat exchanger 135 and one or more central outlet vents 110 to expel heated air.

In the improved system illustrated in FIG. 1B, the airflow from both fans is forced across the apparatus components and across the heat exchanger 135 to be expelled via the one or more central outlet vents. However, the cooling system of the apparatus 100 includes still includes significant resistances to airflow, thus limiting the cooling capacity and performance of the apparatus.

Figure 2A:
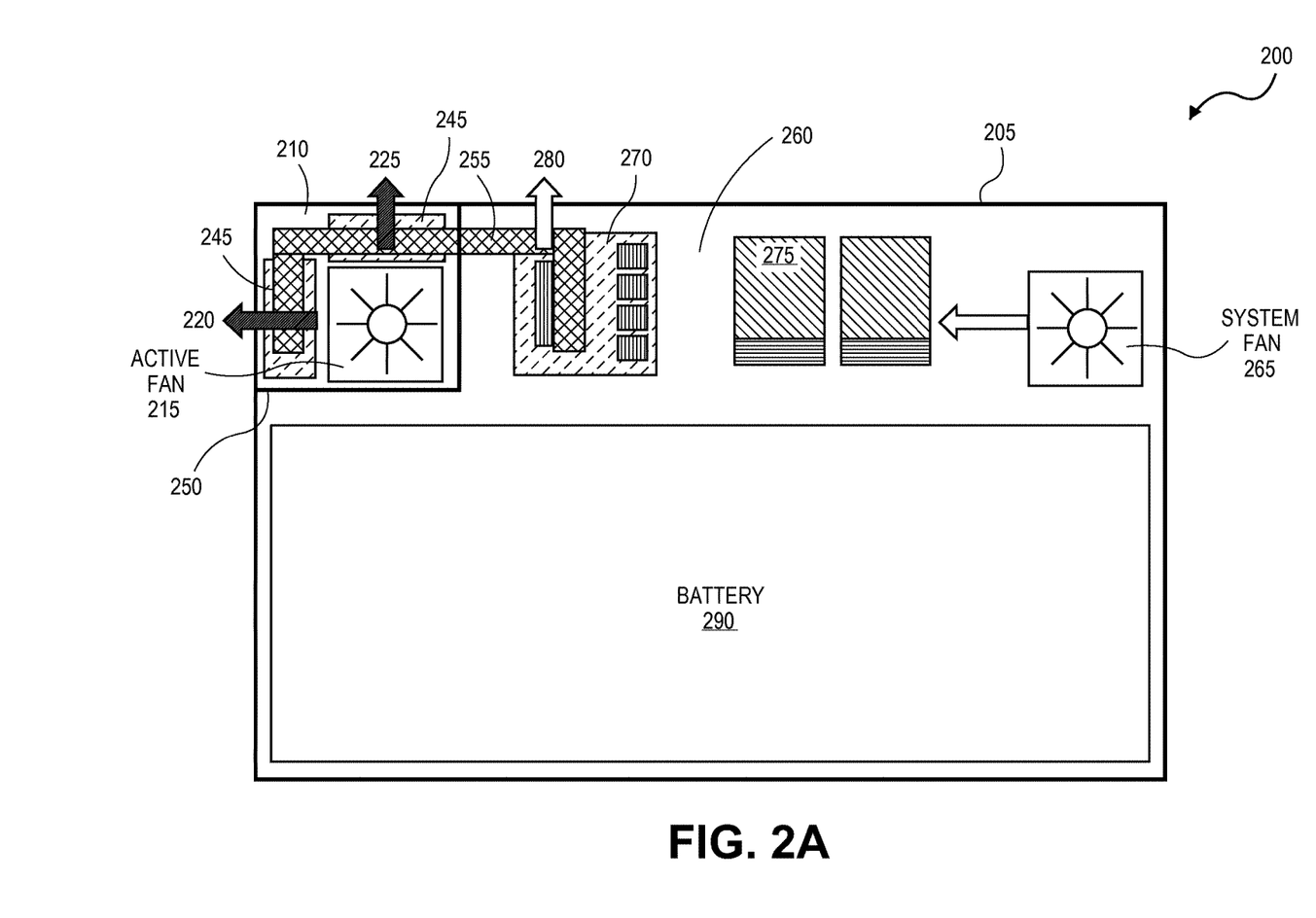
FIG. 2A is an illustration of a first implementation of a partitioned cooling system according to an embodiment.

FIG. 2A is an illustration of first implementation of a partitioned cooling system according to an embodiment. In some embodiments, an electronic apparatus or system 200, such as a mobile device, with casing (also referred to as a cover) 205 includes a partitioned cooling system. The casing is a thin system with a first dimension (a depth) that is significantly smaller than a second dimension and a third dimension (a width and height) of the casing 205, where the figure illustrates the second and third dimensions of the apparatus or system. The figures herein are not intended to be representative of scale.

In some embodiments, the apparatus 200 includes a first partitioned zone (or active cooling zone) 210, and a second partitioned zone (or system cooling zone) 260. In some embodiments, the active cooling zone 210 provides cooling for devices with active cooling solutions. In some embodiments, the active cooling zone 210 and the system cooling zone are separated by a physical partition 250, where the partition 250 prevents or minimizes airflow between the active cooling zone 210 and the system cooling zone 260. In some embodiments, the active cooling zone 210 includes at least two sides of the casing 200, which may allow for the venting of air in at least two directions in certain implementations.

In some embodiments, the active cooling zone 210 includes at least a first fan 215, wherein the first fan 215 may be referred to as an active fan. In some embodiments, the active cooling zone 210 includes one or more outlet vents for the output of heated air from the cooling process. In the implementation illustrated in FIG. 2A, the vents include a first outlet vent 220 in a first side of the casing and a second outlet vent 225 in a second side (referred to herein as the rear) of the casing 205. In some embodiments, the active cooling zone further includes inlet vents such as a top inlet vent, a bottom inlet vent, or both, wherein such the inlet vents are not illustrated in this figure. In some embodiments, the active cooling zone includes a heat exchanger 245 coupled with a heat pipe 255, the heat pipe 255 transferring heat to be expelled from the active cooling zone 210. Because of the use of partitioned cooling, the heat exchanger 245 may be placed in an exterior portion of the active zone such the heat pipe 255 is not in a shadow of the active fan 215 and allows for efficient airflow across the heat exchanger 245 in both a first direction towards outlet vent 220 and a second direction towards outlet vent 225. In some embodiments, the active fan 215 is located in or near an interior portion of the active cooling zone, where the placement of the active fan in an interior corner allows for efficient air flow through the active cooling zone. For example, the active fan may be located in the interior corner of the active cooling zone 210, which is illustrated in FIG. 2A as a rectangular region. However, embodiments are not limited to a particular geometry for the active and system cooling zones.

In some embodiments, the system cooling zone 260 includes at least a second fan 265, wherein the second fan 265 may be referred to as a system fan. In some embodiments, the system cooling zone 260 contains the components of the apparatus 200, including one or more active components 270 and one or components 275 that do not include an active thermal solution. In some embodiments, a heat pipe 255 may extend between the active cooling zone 210 and the system cooling zone 260 to carry heat away from the active components to the active cooling zone to be expelled through the operation of the active cooling fan.

In some embodiments, the system cooling zone 260 may include one or more outlet vents for the output of heated air, such as rear outlet vent 280. In some embodiments, the system cooling zone is physically larger than the active cooling zone. In the implementation illustrated in FIG. 2A, the system fan 265 is placed in a location that is approximately opposite from the outlet vent 280 thus allowing the fan 265 to provide effective airflow for cooling for the larger cooling zone. In some embodiments, the system cooling zone further includes one or more inlet vents as needed, such as a top inlet vent, a bottom inlet vent, a side inlet vent, or a combination of such inlet vents. The one or more inlet vents are not illustrated in FIG. 2A.

In some embodiments, at least one active component is located in the active cooling zone 210 and at least one active component is located in the system cooling zone 260. In some embodiments, the active cooling zone 210 may provide cooling for active components located in both the active cooling zone 210 and the system cooling zone 260. In some embodiments, the apparatus 200 may further include a means of transferring heat from the active cooling zone to the system cooling zone such that the system cooling zone aids in the cooling of one or more active components in the active cooling zone in circumstances in which, for example, the active cooling zone is excessively hot, such as in circumstances in which one or more active components located in the active cooling zone 260 produce excess heat. In some embodiments, the means of transferring heat from the active cooling zone 210 to the system cooling zone 260 may include a second heat pipe to transfer heat to a heat exchanger located in the system cooling zone 260.

Figure 2B:
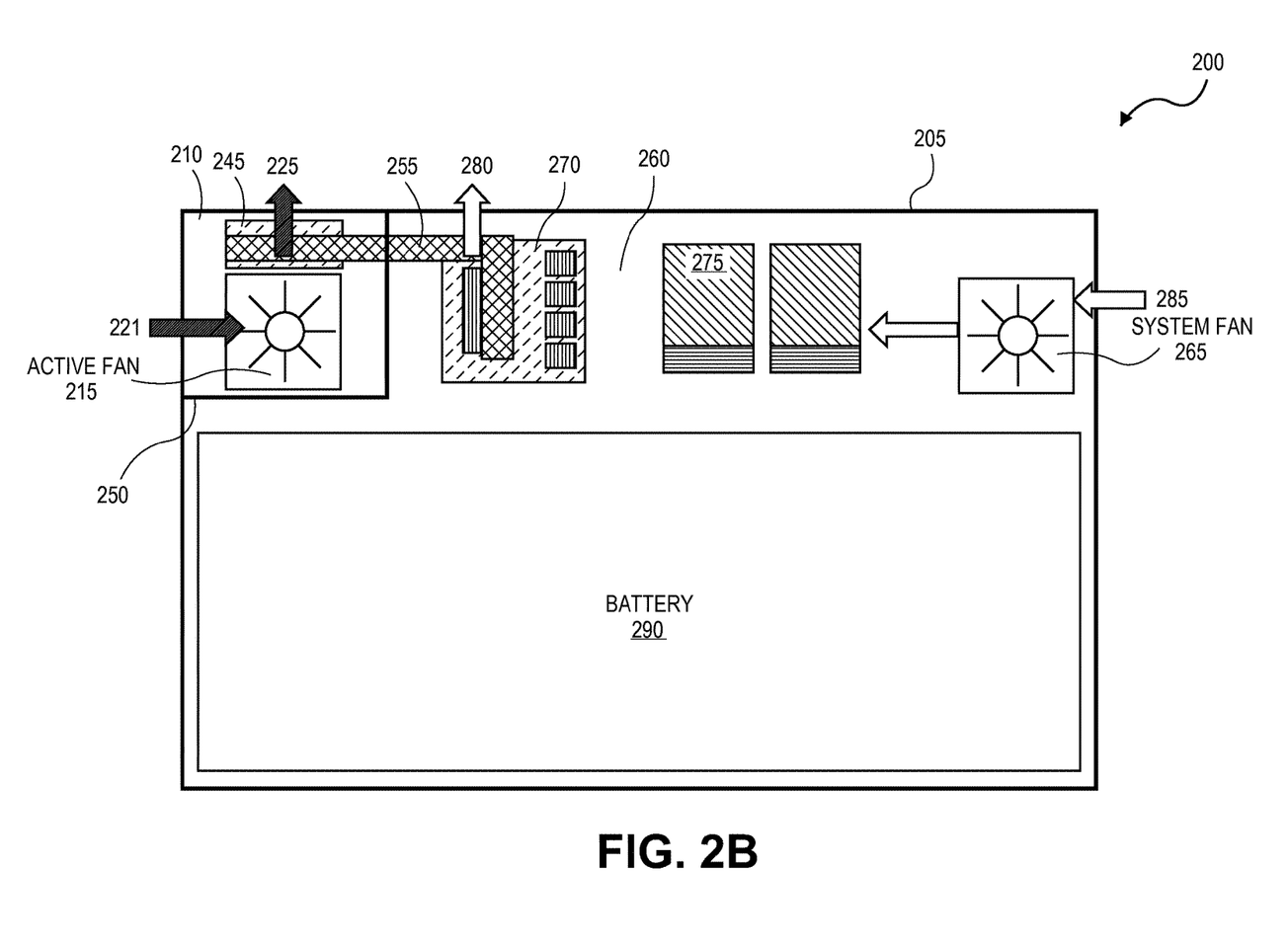
FIG. 2B is an illustration of a second implementation of a partitioned cooling system according to an embodiment.

FIG. 2B is an illustration of a second implementation of a partitioned cooling system according to an embodiment. In some embodiments, the apparatus or system 200 illustrated in FIG. 2B includes a casing 205 and a partitioned cooling system, with active cooling zone 210 including active fan 215 and system cooling zone 260 including system zone fan 265. The active zone includes heat exchanger 245, with heat pipe 255 extending from the active cooling zone 210 into the system cooling zone 260. The system zone includes one or more active components with active cooling 270 and one or more non-active components 275.

In some embodiments, the active cooling zone 210 illustrated in FIG. 2B includes a side inlet vent 221 for entry of cool air and a rear outlet vent 225 to expel heated air. In some embodiments, the active fan 215 operates to propel air across the heat exchanger 245 to be expelled from the outlet vent 225. The active cooling zone 210 may also include top and bottom inlet vents as needed to allow entry of cooling air.

In some embodiments, the system cooling area 260 includes a single outlet vent 280 to expel heated air, and one or more inlet vents as required to provide cooling air, the apparatus 200 as illustrated in FIG. 2B including a side inlet vent 285.

Figure 2C:
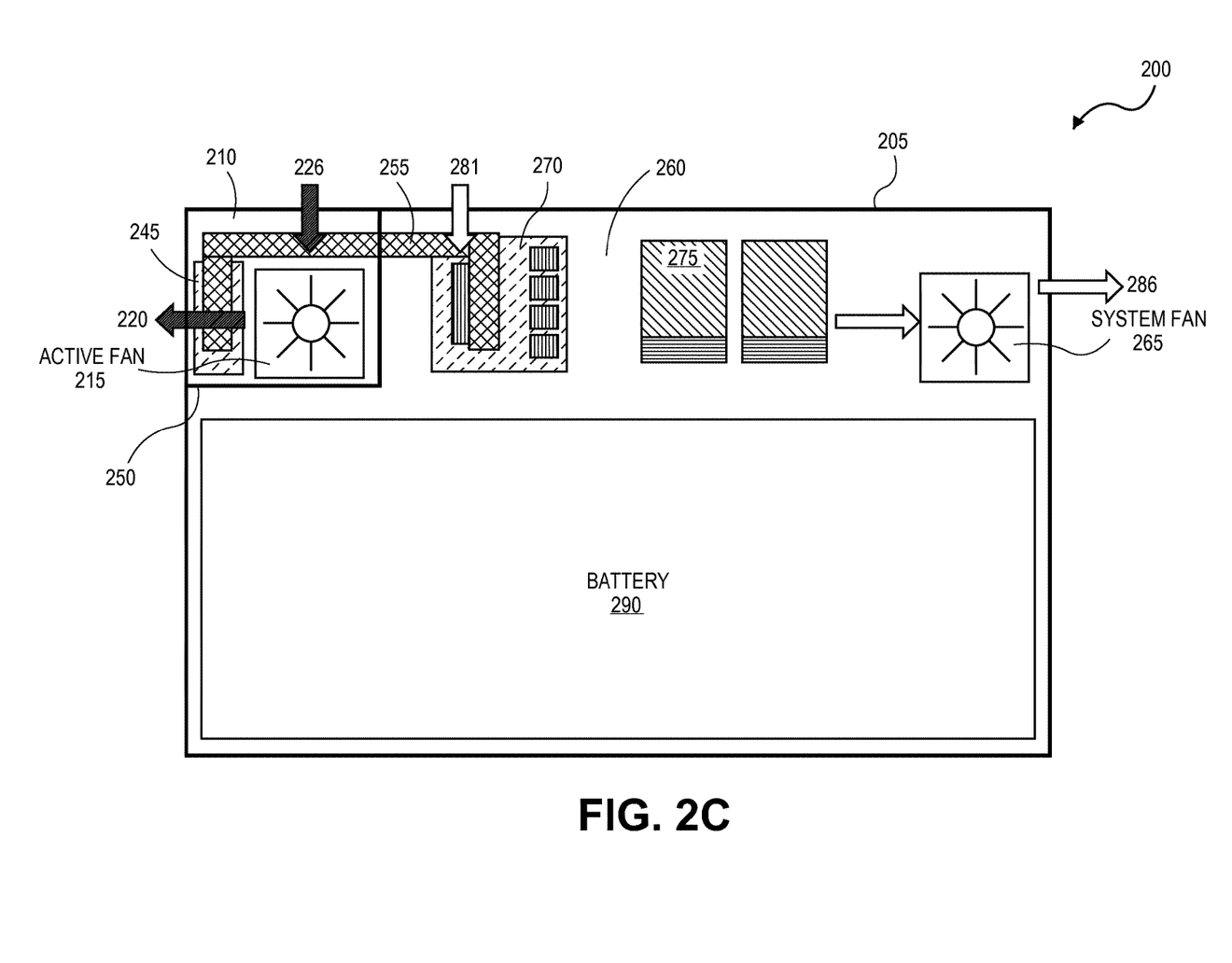
FIG. 2C is an illustration of a third implementation of a partitioned cooling system according to an embodiment.

FIG. 2C is an illustration of a third implementation of a partitioned cooling system according to an embodiment. In some embodiments, the apparatus or system 200 illustrated in FIG. 2C includes a casing 205 and a partitioned cooling system, with active cooling zone 210 including active fan 215 and system cooling zone 260 including system zone fan 265. The active zone includes heat exchanger 245, with heat pipe 255 extending from the active cooling zone 210 into the system cooling zone 260. The system zone includes one or more active components with active cooling 270 and one or more non-active components 275.

In some embodiments, the active cooling zone 210 includes a rear inlet vent 226 for entry of cool air and a side outlet vent 220 to expel heated air. In some embodiments, the active fan operates to propel air across the heat exchanger 245 to be expelled from the outlet vent 220. The active cooling zone 210 may also include top and bottom inlet vents as needed to allow entry of cooling air.

In some embodiments, the system cooling area 260 includes a single side outlet vent 286 adjacent to the system fan 265 to expel heated air, and one or more inlet vents as required to provide cooling air, the apparatus 200 as illustrated in FIG. 2C including a rear inlet vent 281.

FIGS. 2A, 2B, and 2C provide particular combinations of inlet and outlet vents for embodiments of apparatuses utilizing partitioned cooling. However, embodiments are not limited to these implementations, and may include other variations in the placement of inlet and outlet vents for the cooling zones of an apparatus.

Figure 3:
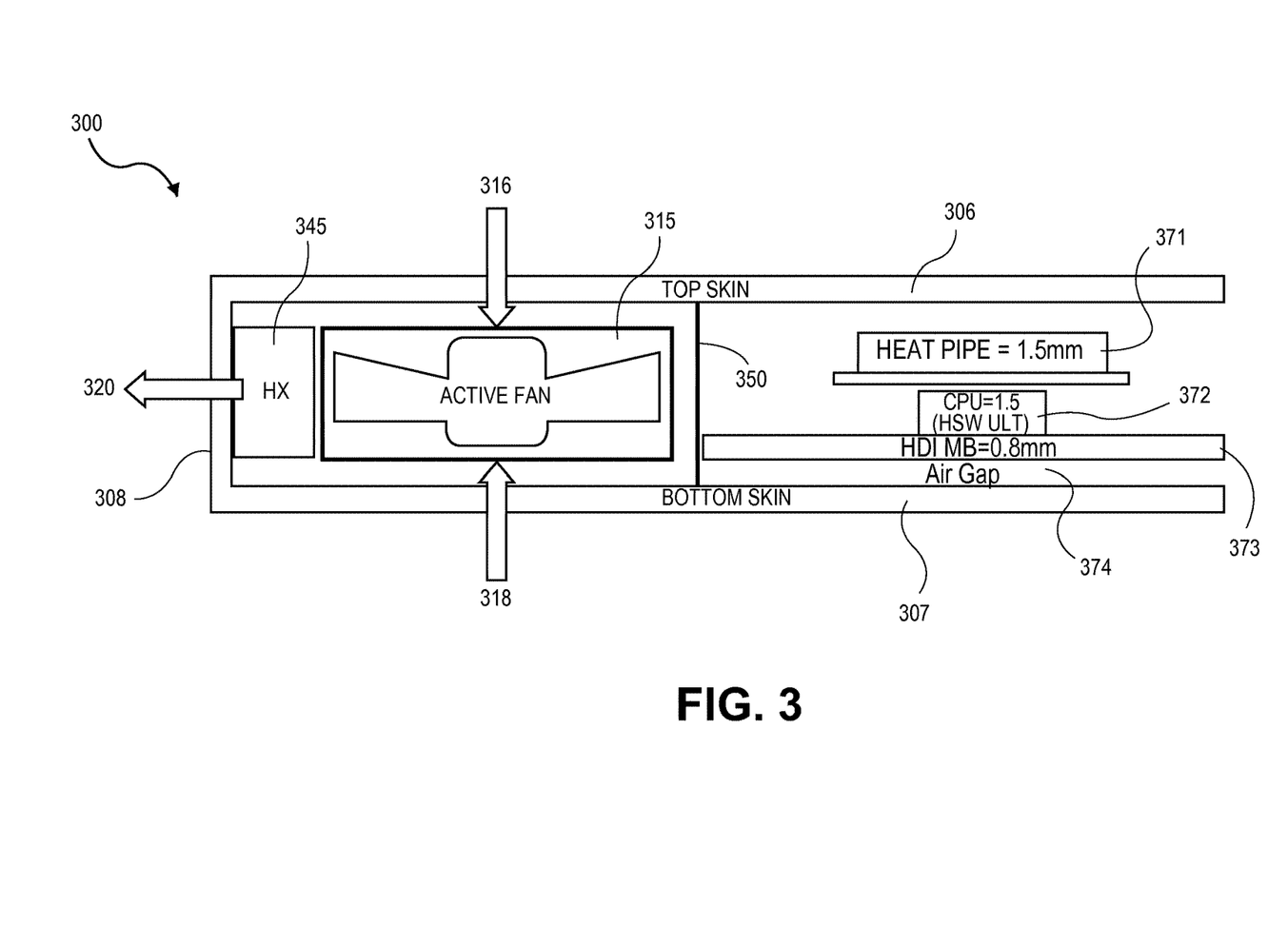
FIG. 3 is an illustration of an active cooling zone of an apparatus according to an embodiment.

FIG. 3 is an illustration of an active cooling zone of an apparatus according to an embodiment. In FIG. 3, a view of an apparatus or system 300, such as a computing system, is viewed from a side to illustrate the thin dimension (depth) of the apparatus or system. The apparatus 300 is a thin system including a top skin 306 and a bottom skin 307, where the distance between the top skin and the bottom skim may be in the range of approximately 8 mm.

In some embodiments, the apparatus 300 includes an active cooling zone illustrated in FIG. 3 as being separated by partition 350 (with the active zone to the left of partition 350). As shown, in addition to the top skin 306 and the bottom skin 307, the casing includes multiple sides, with a first side 308 being illustrated. In some embodiments, the active zone includes an active fan 315 for the active cooling zone components, the active fan being placed in the active cooling zone such that a heat exchanger 345 is only exposed to the active fan. In some embodiments, the placement of the active fan 315 as the only fan with access to the heat exchanger 345 allows for low resistance airflow for effective cooling of active components via outlet vent 320.

In some embodiments, the active components cooled by the operation of the active cooling zone include a CPU 372 on a motherboard 373, with the CPU 372 being in contact with a heat pipe 371 to provide for heat flow into the active zone. In the illustration, the thicknesses of the elements are 1.5 mm for the heat pipe 371; 1.3 mm for the CPU 372; 0.8 mm for the motherboard 373; with an air gap 374 being between the elements and the top of bottom skin.

In some embodiments, the placement of the active fan 315 allows for additional cooling from above 316 through the top skin 306 of the casing and from below 318 through the bottom skin 307 of the casing, thus allowing additional cooling for the active cooling zone of the apparatus 300.

Figure 4:
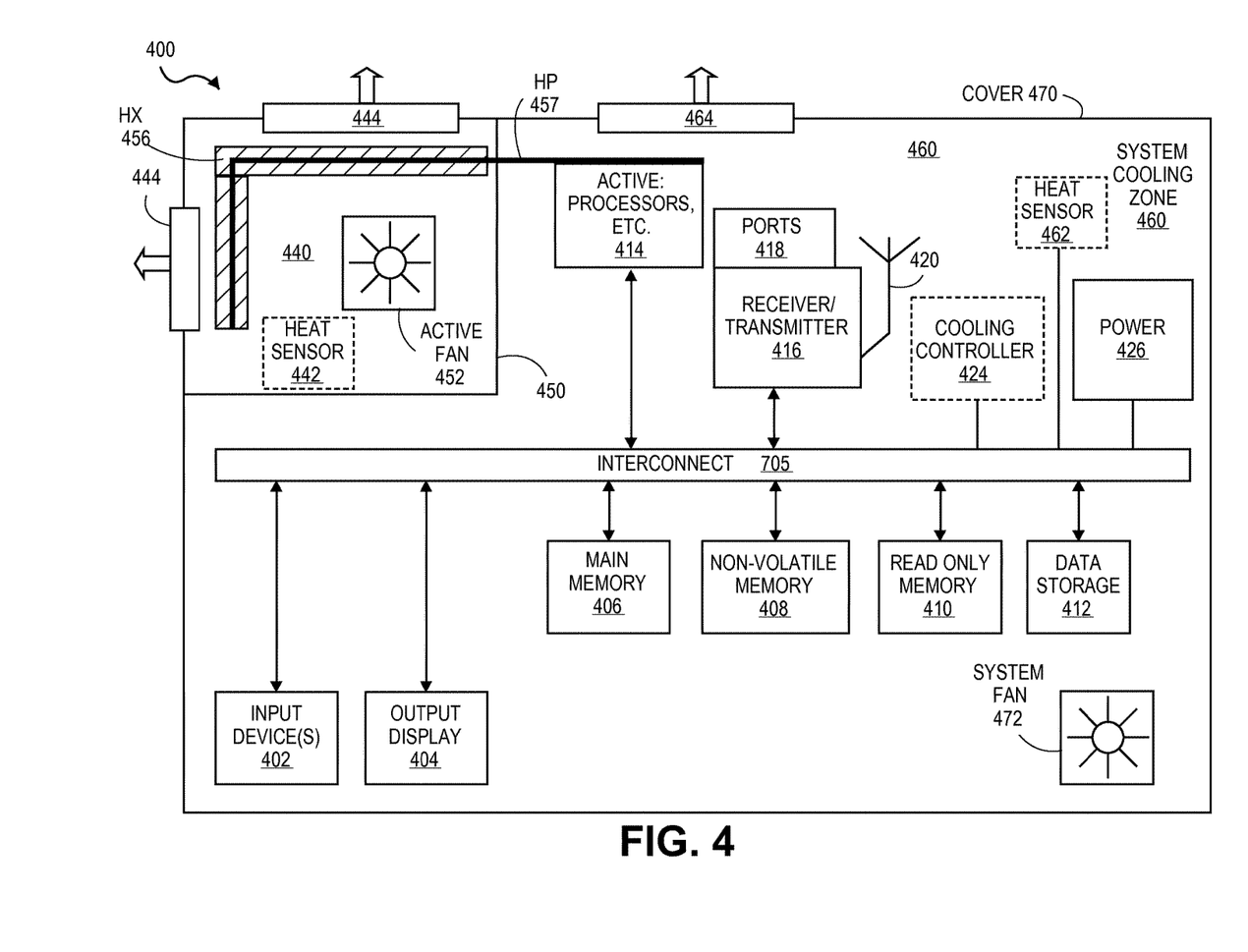
FIG. 4 illustrates an embodiment of an apparatus or system including partitioned cooling.

FIG. 4 illustrates an embodiment of an apparatus or system including partitioned cooling. In some embodiments, an apparatus or system (referred to herein generally as a apparatus) 400 includes a partitioned cooling system to separate an active cooling zone 440 and a system cooling zone 460.

In this illustration, certain standard and well-known components that are not germane to the present description are not shown. In some embodiments, the apparatus 400 includes a cover 470, which may completely enclose the apparatus 400. In some embodiments, the apparatus includes multiple cooling zones to provide more effective cooling performance, the cooling zones including the active cooling zone 440 and the system cooling zone 460, where the zones are separated by a partition 450 that prevents airflow between the zones.

In some embodiments, the active cooling zone 440 includes a first fan (referred to as the active fan) 452 and the system cooling zone 460 includes a second fan (referred to as the system fan) 472. In some embodiments, the active cooling zone 440 includes one or more outlet vents 444 to expel heated air from the active cooling zone, and the system cooling zone 460 includes one or more outlet vents 464 to expel heated air from the system cooling zone 460. In some embodiments, the active cooling zone and system cooling zone each include one or more inlet vents to allow drawing cool air into the apparatus. In some embodiments, an arrangement of outlet vents and inlet vents may include, but is not limited to, an arrangement illustrated in FIG. 2A, FIG. 2B, or FIG. 2C. In some embodiments, the active fan 452 and the system fan 472 are independently controllable.

The apparatus 400 may include a processing means such as one or more processors 414 for processing information, wherein the processors may include a central processing unit (CPU). The processors 414 may comprise one or more physical processors and one or more logical processors. In the illustration provided in FIG. 7 the processors 414 are components with active thermal elements for which the active cooling zone 440 will provide cooling. However, embodiments are not limited to any particular components that receive cooling from the active cooling zone 440.

In some embodiments, the apparatus 400 includes a heat exchanger 456, where the heat exchanger 456 is located in the active cooling zone 440 and is impacted by airflow from the active fan 452. In some embodiments, the apparatus 400 includes a heat pipe 457 to transfer heat from the active components 414 to the active cooling zone for cooling by the operation of the active fan forcing air across the heat exchanger. In some embodiments, the cooling system may include one or more heat sensors 442 for the active cooling zone 440 and one or heat sensors 462 for the system cooling zone. In some embodiments, the apparatus may include a cooling controller 424 to control the operation of the active fan 452 and the system fan 472, while in other embodiments cooling operation may be controlled by the one or more processors 414.

In some embodiments, one or more active components may be located in the active cooling zone 440 and one or more active components may be located in the system cooling zone 460. In some embodiments, the active cooling zone 440 may provide cooling for active components located in both the active cooling zone 440 and the system cooling zone 460. In some embodiments, the apparatus 400 may further include a means of transferring heat from the active cooling zone 440 to the system cooling zone 460 in circumstances in which, for example, the active cooling zone 440 is excessively hot because one or more active components located in the active cooling zone 440 is producing excess heat. In some embodiments, the means of transferring heat from the active cooling zone 440 to the system cooling zone 460 may include a second heat pipe to transfer heat from active components in the active cooling zone to a heat exchanger located in the system cooling zone 460.

In some embodiments, the apparatus may further include the following:

Under some embodiments, the apparatus 400 includes an interconnect or crossbar 405 or other communication means for transmission of data. The interconnect 405 is illustrated as a single interconnect for simplicity, but may represent multiple different interconnects or buses and the component connections to such interconnects may vary. The interconnect 405 shown in FIG. 4 is an abstraction that represents any one or more separate physical buses, point-to-point connections, or both connected by appropriate bridges, adapters, or controllers.

In some embodiments, the apparatus 400 further comprises a random access memory (RAM) or other dynamic storage device or element as a main memory and other memory (including memory buffers) 406 for storing information and instructions to be executed by the processors 414. RAM memory includes dynamic random access memory (DRAM), which requires refreshing of memory contents, and static random access memory (SRAM), which does not require refreshing contents, but at increased cost. DRAM memory may include synchronous dynamic random access memory (SDRAM), which includes a clock signal to control signals, and extended data-out dynamic random access memory (EDO DRAM). The apparatus 400 may include one or more non-volatile memory elements 408, including, for example, flash memory, for the storage of certain elements. The apparatus 400 also may comprise a read only memory (ROM) 410 or other static storage device for storing static information and instructions for the processors 414.

Data storage 412 may also be coupled to the interconnect 405 of the apparatus 400 for storing information and instructions. The data storage 412 may include a magnetic disk, a solid-state drive, an optical disc and its corresponding drive, or other memory device. Such elements may be combined together or may be separate components, and utilize parts of other elements of the apparatus 400.

One or more transmitters or receivers 416 may also be coupled to the interconnect 405. In some embodiments, the apparatus 400 may include one or more ports 418 for the reception or transmission of data. The apparatus 400 may further include one or more antennas 420 for the transmission and reception of data via radio signals.

In some embodiments, the apparatus 400 includes one or more input devices 402 for the input of data, including hard and soft buttons, a joy stick, a mouse or other pointing device, voice command system, or gesture recognition system. In some embodiments, the apparatus includes an output display 404, where the display 404 may include a liquid crystal display (LCD) or any other display technology, for displaying information or content to a user. In some environments, the display 404 may include a touch-screen that is also utilized as at least a part of an input device 402. In some environments, the display 404 may include an audio device, such as a speaker for providing audio information. In some embodiments, the input devices 402 and output display 404 may be exterior to the cover 470, but are illustrated as being contained within the cover for simplicity.

The apparatus 400 may also comprise a power source 426, which may comprise a power supply, a battery, a solar cell, a fuel cell, or other system or device for providing or generating power. The power provided by the power source 426 may be distributed as required to elements of the apparatus 400, and will, for example, supply the power necessary to run the active fan 452 for cooling of the active cooling zone 440 and the system fan 472 for cooling of the system cooling zone 460.

Figure 5:
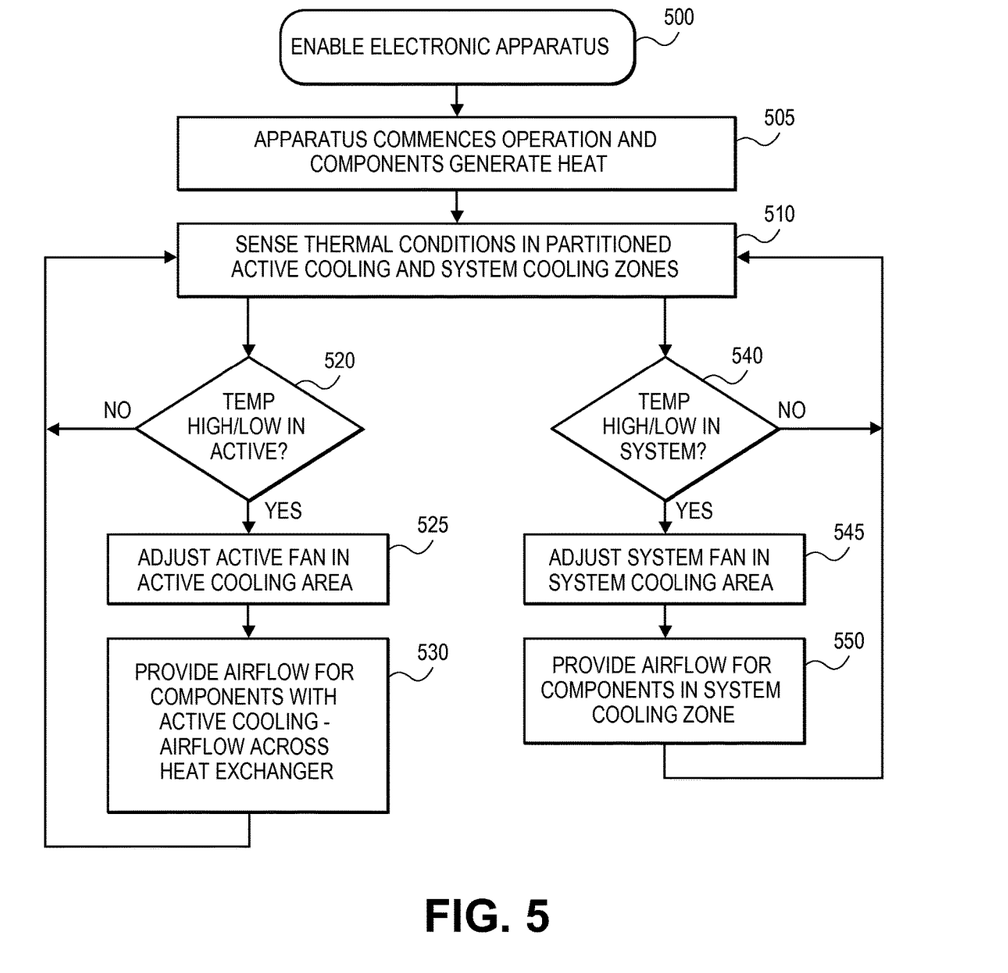
FIG. 5 is a flowchart to illustrate a process for cooling of an apparatus including partitioned cooling zones according to an embodiment.

FIG. 5 is a flow chart to illustrate a process for cooling of an apparatus including partitioned cooling zones according to an embodiment. In some embodiments, an electronic apparatus is enabled 500 and the apparatus commences operation, where components of the apparatus generate heat

505. In some embodiments, the apparatus senses thermal conditions in each of a plurality of cooling zones 510, wherein the cooling zones may includes an active cooling zone and a system cooling zone.

In some embodiments, upon a temperature for the active cooling zone being determined to be high (above an upper threshold for the active cooling zone) or low (below a lower threshold for the active cooling zone) 520, the apparatus is to adjust operation of an active fan in the active cooling zone to increase or decrease airflow generated by the fan 525. In some embodiments, the apparatus provides airflow from the active fan to provide cooling for components with active thermal elements. In some embodiments, the airflow includes the provision of airflow across a heat exchanger 530.

In some embodiments, upon a temperature for the system cooling zone being determined to be high (above an upper threshold for the system cooling zone) or low (below a lower threshold for the system cooling zone) 540, the apparatus is to adjust operation of a system fan in the system cooling zone to increase or decrease airflow generated by the fan 545. In some embodiments, the apparatus provides airflow from the system fan to provide cooling for components without active thermal elements 550.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, an apparatus includes: a casing; one or more components, including one or more components that include an active thermal element; a partition to separate area within the casing into a first cooling zone and a second cooling zone, wherein the first cooling zone provides cooling for the one or more components that include an active thermal element; and a first fan located in the first cooling zone, the first fan to produce airflow for cooling in the first cooling zone and a second fan located in the second cooling zone to produce airflow for the cooling in the second cooling zone.

In some embodiments, there is no airflow between the first cooling zone and the second cooling zone.

In some embodiments, the one or more components that include an active thermal element are located outside of the first cooling zone.

In some embodiments, the one or more components further include one or more components that do not include an active thermal element, wherein the one or more components that include an active thermal element and the one or more components that do not include an active thermal element are located in the second cooling zone.

In some embodiments, the first cooling zone includes a first set of vents including at least one outlet vent and at least one inlet vent and the second cooling zone includes a second set of vents including at least one outlet vent and at least one inlet vent.

In some embodiments, the apparatus further includes a heat exchanger for cooling the one or more components with an active thermal element, the heat exchanger being located in the first cooling zone. In some embodiments, heat exchanger is located between the first fan and one or more outlet vents of the first set of vents. In some embodiments, the apparatus further includes a heat pipe, the heat pipe running between the first cooling zone and the second cooling zone, the heat pipe transferring heat from the one or more components that include an active thermal element.

In some embodiments, the one or more components that include an active thermal element include at least one component located in the first cooling zone and at least one component located in the second cooling zone, the first cooling zone providing cooling for the the components that include an active thermal element in both the first cooling zone and the second cooling zone.

In some embodiments, the second cooling zone provides cooling for the one or more components located in the first cooling zone.

In some embodiments, the first cooling zone borders at least two sides of the casing, the first fan being located in an interior portion of the first cooling zone.

In some embodiments, the first fan and the second fan are independently controllable.

In some embodiments, the casing is a thin system with a first dimension that is significantly smaller than a second dimension or a third dimension of the casing.

In some embodiments, the casing includes a top skin and a bottom skin, the first fan receiving cooling from either or both of the top skin and the bottom skin.

In some embodiments, a method includes: operating an electronic apparatus, the apparatus including a partition between a first cooling zone and a second cooling zone, the apparatus further including a first fan located in the first cooling zone and a second fan located in the second cooling zone; upon determining that a temperature in the first cooling zone is above an upper threshold or below a lower threshold for the first cooling zone, increasing or decreasing airflow generated by the first fan; and upon determining that a temperature in the second cooling zone is above an upper threshold or below a lower threshold for the second cooling zone, increasing or decreasing airflow generated by the second fan. In some embodiments, the apparatus includes a plurality of components, the plurality of components including one or more components with active thermal elements, the first cooling zone providing cooling for the one or more components with active thermal elements.

In some embodiments, the airflow generated by the first fan does not flow through the second cooling zone and wherein the airflow generated by the second fan does not flow through the first cooling zone.

In some embodiments, the first cooling zone includes a first set of vents including at least one outlet vent and the second cooling zone includes a second set of vents including at least one outlet vent, and wherein increasing or decreasing the air flow generated by the first fan operates to respectively increase or decrease air flow out of the at least one outlet vent of the first set of vents, and increasing or decreasing the air flow generated by the second fan operates to respectively increase or decrease air flow out of the at least one outlet vent of the second set of vents.

In some embodiments, the apparatus includes a heat exchanger for the one or more components with an active thermal element, the heat exchanger being located in the first cooling zone, and wherein increasing or decreasing the airflow generated by the first fan operates to respectively increase or decrease airflow impacting the heat exchanger. In some embodiments, the apparatus includes a heat pipe, the heat pipe running between the first cooling zone and the second cooling zone, the heat pipe providing for transfer of heat from the second cooling zone to the first cooling zone.

In some embodiments, control of a level of airflow of the first fan is independent of control of a level of airflow of the second fan.

In some embodiments, machine-readable storage includes machine-readable instructions that, when executed, implement the method.

In some embodiments, a cooling system for an electronic apparatus includes: a first fan located in a first cooling zone of the apparatus, the first fan to produce airflow for cooling in the first cooling zone, the first cooling zone to provide cooling for one or more components with active cooling elements located outside of the first cooling zone, a heat pipe transferring heat from the components to the first cooling zone; a second fan located in a second cooling zone to produce airflow for the cooling in the second cooling zone, wherein the first cooling zone and the second cooling zone are separated by a partition; and a controller to independently control airflow generated by the first fan and airflow generated by the second fan.

In some embodiments, the system further includes a heat exchanger coupled with the heat pipe to provide cooling of the one or more components with an active thermal element, the heat exchanger being located in the first cooling zone and being impacted by airflow generated by the first fan. In some embodiments, the heat exchanger is located between the first fan and at least one outlet. In some embodiments, the heat exchanger is not impacted by airflow generated by the second fan.

In some embodiments, the controller is one of a separate cooling controller or a processor.

In some embodiments, a non-transitory computer-readable storage medium having stored thereon data representing sequences of instructions that, when executed by a processor, cause the processor to perform operations including: operating an electronic apparatus, the apparatus including a partition between a first cooling zone and a second cooling zone; and controlling cooling for first cooling zone and the second cooling zone by independently controlling airflow generated by a first fan located in the first cooling zone, and controlling airflow generated by a second fan located in the second cooling zone. In some embodiments, the first cooling zone provides cooling for one or more components with active thermal elements that are located outside of the first cooling zone.

In some embodiments, the airflow generated by the first fan does not flow through the second cooling zone and the airflow generated by the second fan does not flow through the first cooling zone.

In some embodiments, the apparatus includes a heat exchanger for the one or more components with an active thermal element, the heat exchanger being located in the first cooling zone, and wherein controlling the airflow generated by the first fan controls airflow impacting the heat exchanger.

In some embodiments, an apparatus includes means for controlling cooling for a first cooling zone and a second cooling zone of an apparatus, the first cooling zone and the second cooling zone being separated by a partition, the means to independently control airflow generated by a first fan located in the first cooling zone, and control airflow generated by a second fan located in the second cooling zone. In some embodiments, the first cooling zone provides cooling for one or more components with active thermal elements that are located outside of the first cooling zone.

In some embodiments, the apparatus includes a heat exchanger for the one or more components with an active thermal element, the heat exchanger being located in the first cooling zone, wherein controlling the airflow generated by the first fan includes controlling airflow impacting a heat exchanger for the one or more components with an active thermal element.

In some embodiments, a method includes operating an electronic apparatus, the apparatus including a partition between a first cooling zone and a second cooling zone; and controlling cooling for first cooling zone and the second cooling zone by independently: controlling airflow generated by a first fan located in the first cooling zone, and controlling airflow generated by a second fan located in the second cooling zone. In some embodiments, the first cooling zone provides cooling for one or more components with active thermal elements that are located outside of the first cooling zone.

In some embodiments, the apparatus includes a heat exchanger for the one or more components with an active thermal element, the heat exchanger being located in the first cooling zone, and wherein controlling the airflow generated by the first fan controls airflow impacting the heat exchanger.

What is claimed is:

1. An apparatus comprising: a casing;
an active thermal element and a processor thermally coupled to the active thermal element;
a partition to separate an area within the casing into a first cooling zone that includes the active thermal element and a second cooling zone that includes the processor, wherein there is no airflow between the first cooling zone and the second cooling zone, wherein the first cooling zone provides cooling for the active thermal element; and
a first fan located in the first cooling zone, the first fan to produce airflow for cooling in the first cooling zone and a second fan located in the second cooling zone to produce airflow for the cooling in the second cooling zone,
wherein the active thermal element includes a heat exchanger for cooling the processor, the heat exchanger being located in the first cooling zone between the first fan and at least one outlet vent of a first set of vents located in the first cooling zone.

2. The apparatus of claim 1, wherein the first set of vents includes at least one inlet vent and the second cooling zone includes a second set of vents including at least one outlet vent and at least one inlet vent.

3. The apparatus of claim 2, further comprising a heat pipe, the heat pipe running between the first cooling zone and the second cooling zone, the heat pipe transferring heat from the processor in the second cooling zone to the heat exchanger located within the first cooling zone.

4. The apparatus of claim 1, wherein the first cooling zone is to provide cooling for the components in both the first cooling zone and the second cooling zone.

5. The apparatus of claim 1, wherein the first cooling zone borders at least two sides of the casing, the first fan being located in an interior portion of the first cooling zone.

6. The apparatus of claim 1, wherein the first fan and the second fan are independently controllable.

7. The apparatus of claim 1, wherein the casing is a thin system with a first dimension that is significantly smaller than a second dimension or a third dimension of the casing.

8. The apparatus of claim 1, wherein the casing includes a top skin and a bottom skin, the first fan receiving cooling from either or both of the top skin and the bottom skin.

9. A method comprising:
operating an electronic apparatus, the apparatus including a partition between a first cooling zone and a second cooling zone, wherein there is no airflow between the first cooling zone and the second cooling zone, the apparatus further including a first fan located in the first cooling zone and a second fan located in the second cooling zone;
upon determining that a temperature in the first cooling zone is above an upper threshold or below a lower threshold for the first cooling zone, increasing or decreasing airflow generated by the first fan; and
upon determining that a temperature in the second cooling zone is above an upper threshold or below a lower threshold for the second cooling zone, increasing or decreasing airflow generated by the second fan;
wherein the apparatus includes a plurality of components, the plurality of components including an active thermal element and a processor thermally coupled to the active thermal element, the active thermal element being located in the first cooling zone, the fan providing cooling to the active thermal element which provides cooling for the processor located in the second cooling zone, the active thermal element including a heat exchanger.

10. The method of claim 9, wherein the airflow generated by the first fan does not flow through the second cooling zone and wherein the airflow generated by the second fan does not flow through the first cooling zone.

11. The method of claim 9, wherein the first cooling zone includes a first set of vents including at least one outlet vent and the second cooling zone includes a second set of vents including at least one outlet vent; and
wherein increasing or decreasing the air flow generated by the first fan operates to respectively increase or decrease air flow out of the at least one outlet vent of the first set of vents, and increasing or decreasing the air flow generated by the second fan operates to respectively increase or decrease air flow out of the at least one outlet vent of the second set of vents.

12. The method of claim 9, wherein the apparatus includes a heat pipe, the heat pipe running between the first cooling zone and the second cooling zone, the heat pipe providing for transfer of heat from the second cooling zone to the first cooling zone.

13. The method of claim 9, wherein control of a level of airflow of the first fan is independent of control of a level of airflow of the second fan.

14. A cooling system for an electronic apparatus comprising:
a first fan located in a first cooling zone of the electronic apparatus, the first fan to produce airflow for cooling in the first cooling zone, the first cooling zone to provide cooling for a plurality of components that include an active cooling element and a processor thermally coupled to the active thermal element, the first cooling zone including the first fan and the active thermal element coupled to the first fan, wherein the processor is located outside of the first cooling zone, a heat pipe transferring heat from the components in a second cooling zone to the first cooling zone;

a second fan located in the second cooling zone to produce airflow for the cooling in the second cooling zone, wherein the first cooling zone and the second cooling zone are separated by a partition and there is no airflow between the first cooling zone and the second cooling zone; and a controller to independently control airflow generated by the first fan and airflow generated by the second fan.

15. The cooling system of claim 14, wherein the active cooling element includes a heat exchanger coupled with the heat pipe, the heat exchanger being located in the first cooling zone and being impacted by airflow generated by the first fan.

16. The cooling system of claim 15, wherein the heat exchanger is located between the first fan and at least one outlet.

17. The cooling system of claim 15, wherein the heat exchanger is not directly impacted by airflow generated by the second fan.

18. The cooling system of claim 14, wherein the controller is one of a separate cooling controller or a processor.

19. A non-transitory computer-readable storage medium having stored thereon data representing sequences of instructions that, when executed by a processor, cause the processor to perform operations comprising:

operating an electronic apparatus, the apparatus including a partition between a first cooling zone and a second cooling zone, wherein there is no airflow between the first cooling zone and the second cooling zone; and controlling cooling for first cooling zone and the second cooling zone by independently: controlling airflow generated by a first fan located in the first cooling zone, and controlling airflow generated by a second fan located in the second cooling zone;

wherein the first cooling zone includes the first fan and an active thermal element coupled to the first fan to provide cooling for a processor that is located outside of the first cooling zone.

20. The medium of claim 19, wherein the active thermal element includes a heat exchanger, the heat exchanger being located in the first cooling zone, and wherein controlling the airflow generated by the first fan controls airflow impacting the heat exchanger.

* * * * *